(12) United States Patent
Wang et al.

(10) Patent No.: US 12,489,033 B2
(45) Date of Patent: Dec. 2, 2025

(54) SILICON-BASED FAN OUT PACKAGE STRUCTURE AND PREPARATION METHOD THEREFOR

(71) Applicant: PEKING UNIVERSITY, Beijing (CN)

(72) Inventors: Wei Wang, Beijing (CN); Yuchi Yang, Beijing (CN); Jianyu Du, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 400 days.

(21) Appl. No.: 18/024,389

(22) PCT Filed: Jun. 2, 2021

(86) PCT No.: PCT/CN2021/097815
§ 371 (c)(1),
(2) Date: Mar. 2, 2023

(87) PCT Pub. No.: WO2022/241848
PCT Pub. Date: Nov. 24, 2022

(65) Prior Publication Data
US 2023/0317559 A1    Oct. 5, 2023

(30) Foreign Application Priority Data

May 21, 2021    (CN) .......................... 202110557585.7

(51) Int. Cl.
*H01L 23/473* (2006.01)
*H01L 21/48* (2006.01)
*H01L 23/427* (2006.01)

(52) U.S. Cl.
CPC ........ *H01L 23/473* (2013.01); *H01L 21/4871* (2013.01); *H01L 23/427* (2013.01)

(58) Field of Classification Search
CPC .. H01L 23/473; H01L 23/427; H01L 21/4871
See application file for complete search history.

(56) References Cited

U.S. PATENT DOCUMENTS

2021/0066164 A1*   3/2021   Wu .................... H01L 23/147

OTHER PUBLICATIONS

Machine English Translation of CN 111128976 "A Chip Stacked Package Radiating Structure and Manufacturing Method Thereof", Ciu et al., published Oct. 1, 2021.*

* cited by examiner

*Primary Examiner* — Peniel M Gumedzoe
(74) *Attorney, Agent, or Firm* — Scully, Scott, Murphy & Presser, P.C.

(57) ABSTRACT

The present disclosure relates to a silicon-based fan out package structure including embedded manifold type microchannels, which includes: a chip, which includes a substrate and embedded microchannels located on a back of the substrate; a silicon-based adapter plate, which includes a groove for burying the chip, a manifold channel located below the groove and communicated with the groove, a liquid inlet and a liquid outlet; a low temperature sealing layer for sealing the embedded microchannels with the manifold channel, the low temperature sealing layer being located between the chip and the silicon-based adapter plate; and a rewiring layer at a top of the chip. The present disclosure also relates to a preparation method for a silicon-based fan out package structure including embedded manifold type microchannels.

12 Claims, 4 Drawing Sheets

SILICON-BASED FAN OUT PACKAGE STRUCTURE AND PREPARATION METHOD THEREFOR

TECHNICAL FIELD

The present disclosure relates to the field of IC chip heat dissipation, and specifically relates to a silicon-based fan out package structure including embedded manifold type microchannels and a preparation method therefor.

BACKGROUND

With the increase of integration level and power consumption and feature size reduction of modern electronic chips, a rapid increase of chip system heat generation has become a major challenge in the development and application of advanced electronic chip systems. Liquid cooling is a technology to cool high-heat-generation power modules in electronic devices through liquid, which is used for chip modules with high power consumption of thermal design, mainly for cooling high-power chips. Since liquid has a larger specific heat capacity than gas, and there is generally a larger convective heat exchange coefficient when the liquid and a solid surface move relative to each other, liquid cooling can achieve a smaller thermal resistance between transistors and the environment. Liquid cooling can be classified into non-embedded type and embedded type according to an integration mode with the chip. Non-embedded liquid cooling means that a metal block with an internal liquid path is surface-mounted with a heat generating chip through a high thermal conductivity material, which flows into a low temperature working medium to take away the heat generated by the chip. Embedded liquid cooling is a cooling technology that uses a cooling working medium to directly wash a surface (or back side) of the chip. In the embedded liquid cooling technology, generally, microchannels are directly formed on the back side of the chip. When the cooling working medium flows through the microchannels, it washes fins and takes away the heat transferred from the transistors to the surfaces of the fins.

In the non-embedded liquid cooling heat dissipation technology, thermal conductive silicone grease or other gluing materials will be used between the metal block and the chip, and even a sealing cover plate may be used; therefore, there are multiple material interfaces, and an interface thermal resistance is introduced for many times, which affects the heat dissipation efficiency. On the other hand, with the higher and higher integration level of transistors in the chip, the heat generated by high-power transistors causes the thermal resistance transferred to the surface (or back side) of the chip through the multi-layer structure inside the chip to be larger and larger (the internal thermal resistance increases), whereas non-embedded cooling can only reduce an external thermal resistance thereof. Therefore, with the increasing complexity and integration level of transistors, the heat dissipation efficiency of non-embedded liquid cooling is gradually decreasing.

The embedded liquid cooling heat dissipation technology takes away heat by making the cooling working medium directly flow through the microchannels embedded in the chip, so there is no interface thermal resistance, which also enables the embedded cooling to have a higher efficiency and which is suitable for heat dissipation of high-power chips. The design of liquid cooling heat dissipation channels is usually of a pin-fin structure or a radial flow diversion structure, which has the disadvantages of large flow resistance and large temperature rise of the cooling working medium.

However, when processing and preparing the embedded cooling channels, after heat dissipation fins are etched in a back cavity, it is required to bond and seal them with a cover plate to achieve the microchannel structure. Traditional bonding methods, such as silicon-glass anodic bonding or silicon-silicon direct bonding, require a higher voltage or temperature. IC devices will be subject to electrical failure under this bonding condition, so the traditional embedded cooling technology is incompatible with IC.

Therefore, it is urgent to develop a package structure with both low temperature process compatibility and packaging compatibility and high heat dissipation efficiency.

SUMMARY

An object of the present disclosure is to overcome the disadvantages in the prior art and provide a silicon-based fan out package structure including embedded manifold type microchannels, which has both low temperature process compatibility and packaging compatibility and high heat dissipation efficiency. The manifold type microchannels have the advantages of short flow distance, small flow resistance and small thermal resistance, and are more suitable for being integrated in high-power chips for efficient heat dissipation.

Another object of the present disclosure is to provide a preparation method for a silicon-based fan out package structure including embedded manifold type microchannels.

In order to achieve the above objects, the following technical solutions are provided by the present disclosure.

A silicon-based fan out package structure including embedded manifold type microchannels, which includes:
 a chip, which includes a substrate and embedded microchannels located on a back of the substrate;
 a silicon-based adapter plate, which includes a groove for burying the chip, a manifold channel located below the groove and communicated with the groove, a liquid inlet and a liquid outlet;
 a low temperature sealing layer for sealing the embedded microchannels with the manifold channel, the low temperature sealing layer being located between the chip and the silicon-based adapter plate; and
 a rewiring layer at a top of the chip.

A preparation method for a silicon-based fan out package structure including embedded manifold type microchannels, which includes the following steps:
 providing a chip, and fabricating embedded microchannels on a back of a substrate of the chip;
 preparing a silicon-based adapter plate, which includes a groove for burying the chip, a manifold channel located below the groove and communicated with the groove, a liquid inlet and a liquid outlet;
 forming a low temperature sealing layer between the chip and the silicon-based adapter plate for sealing the embedded microchannels with the manifold channel; and
 preparing a rewiring layer at a top of the chip.

As compared with the prior art, the following technical effects are achieved by the present disclosure.

1. The heat dissipation technology of the present disclosure is liquid cooling heat dissipation based on embedded microchannels, which dissipates the heat of the chip through the fluid in the channel structure embedded in the back cavity of the chip. As compared with other non-embedded heat dissipation means, this technology avoids the conductive thermal resistance of internal materials of the package and the interface thermal resistance between different materials, which obtains higher heat dissipation efficiency, greatly reduces the temperature rise of high-power chips, ensures the stable operation of the chip in a high-performance mode, and prolongs a service life of the chip.

2. The heat dissipation technology of the present disclosure has circuit compatibility, and the heat dissipation chip in the application object has generality. Whether the chip is a RF power chip or a logic digital chip, this technology can be used for heat dissipation as long as microchannels are etched on the back side of the chip and the chip is then bonded with a specific manifold channel adapter plate; as compared with the lead wire bonding packaging, this solution can realize higher-density electrical I/O packaging, and has a smaller interconnection resistance; it is a common and efficient cooling method for all chips with high power consumption value of thermal design.

3. The preparation process of the heat dissipation technology of the present disclosure is simple; it is only required to etch the heat dissipation microchannels on the target chip so that the chip can be glued with the manifold channel adapter plate; it is also possible to prepare metal thin films on both bonding surfaces respectively, and IC compatible low temperature eutectic bonding is used to achieve channel sealing. No bulky metal heat dissipation fins, heat dissipation fans or heat dissipation cold plates are required to be integrated in this solution, which can greatly reduce the volume of the heat dissipation system and improve the integration level of the package structure.

4. The present disclosure is compatible with the silicon-based fan out packaging process. Since the embedded microchannels and the manifold channel of the present disclosure are both designed based on the silicon-based fan out package structure, the flow path structure does not affect the electrical structure, so the flow channel design can be added in the existing silicon-based fan out solution without changing the electrical design, thus achieving the embedded microchannels cooling solution in the silicon-based fan out package.

5. The present disclosure is compatible with 2.5D and 3D integration modes. Since the through silicon via (TSV) structure can be pre-buried in the adapter plate, electrical signals can be led out from upper and lower sides of the adapter plate respectively. If the heat dissipation target is a high-power chip such as a processor, low-power-consumption chips such as a memory can be stacked on the top, which are then connected to a substrate or PCB through TSV and bump structure to complete packaging; it is an efficient cooling method suitable for all bottom chips of 2.5D and 3D integration modes.

BRIEF DESCRIPTION OF THE DRAWINGS

Upon reading the detailed description of the preferred embodiments below, various other advantages and benefits will become clear to those skilled in the art. The accompanying drawings are only used for the purpose of illustrating preferred embodiments, and should not be considered as a limitation to the present disclosure. Moreover, throughout the drawings, the same reference signs are used to denote the same components, in which.

LIST OF REFERENCE SIGNS

Figure 1:
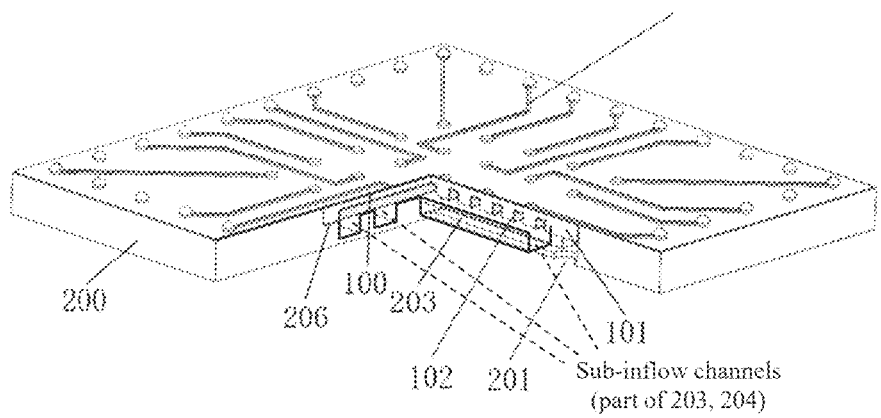
FIG. 1 shows a schematic view of a silicon-based fan out package structure including embedded manifold type microchannels according to the present disclosure.

100: chip; 101: substrate; 102: embedded microchannel; 200: silicon-based adapter plate; 201: liquid inlet; 202: liquid outlet; 203: manifold channel; 204: inflow channel; 205: outflow channel; 206: groove; 207: TSV; 300: rewiring layer.

DETAILED DESCRIPTION

Hereinafter, embodiments of the present disclosure will be described with reference to the drawings. However, it should be understood that the description is only illustrative, and is not intended to limit the scope of the present disclosure. In addition, in the following, the description of known structures and technologies will be omitted to avoid unnecessarily obscuring the concept of the present disclosure.

Various schematic structural views according to the embodiments of the present disclosure are shown in the drawings. These drawings are not drawn to scale, in which some details are enlarged for the purpose of clear expression, and some details may be omitted. The shapes of various regions and layers as well as their relative size and positional relationships shown in the drawings are only illustrative. In practice, there may be deviations caused by manufacturing tolerances or technical restrictions, and those skilled in the art can additionally design regions/layers with different shapes, sizes and relative positions as actually required.

In the context of the present disclosure, when a layer/element is referred to as being "above" another layer/element, the layer/element can be directly located on the other layer/element, or an intervening layer/element may exist between them. In addition, if a layer/element is "above" another layer/element in one orientation, then when the orientation is turned over, the layer/element can be "below" the other layer/element.

The present disclosure will be further described below in connection with specific drawings.

FIG. 1 shows a schematic view of a silicon-based fan out package structure including embedded manifold type microchannels according to the present disclosure. Specifically, as shown in FIG. 1, the silicon-based fan out package structure including embedded manifold type microchannels according to the present disclosure includes: a chip 100, which includes a substrate 101 and embedded microchannels 102 located on a back of the substrate; a silicon-based adapter plate 200, which includes a groove 206 for burying the chip 100, a manifold channel 203 located below the groove and communicated with the groove, a liquid inlet 201 and a liquid outlet 202 (not shown in FIG. 1); a low temperature sealing layer (not shown in FIG. 1) for sealing the embedded microchannels 102 with the manifold channel 203, the low temperature sealing layer being located between the chip and the silicon-based adapter plate; and a rewiring layer 300 at a top of the chip.

As can be seen from FIG. 1, the embedded microchannels 102 are located directly above the manifold channel 203.

Figure 2:
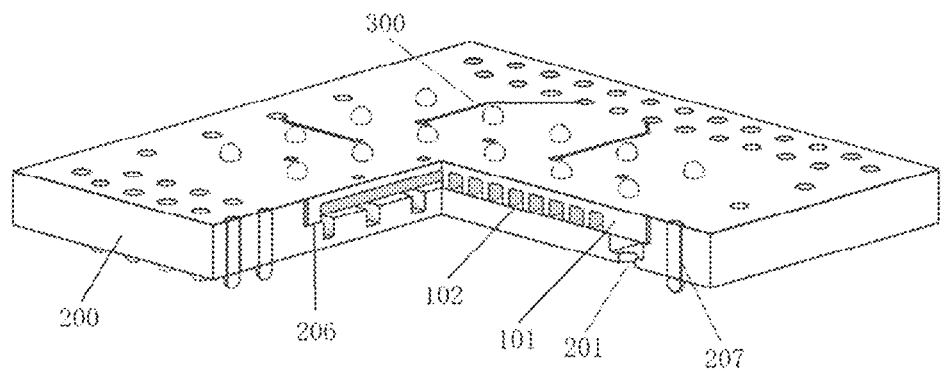
FIG. 2 shows a schematic view of a silicon-based fan out package structure including embedded manifold type microchannels and having a TSV structure 207? according to the present disclosure.

FIG. 2 shows a schematic view of a silicon-based fan out package structure including embedded manifold type microchannels and having a TSV structure according to the present disclosure. Specifically, as shown in FIG. 2, the silicon-based adapter plate 200 has a TSV structure 207.

FIGS. 1 and 2 show the rewiring layer 300. The present disclosure does not impose special limitation on the material of metallized wiring in the rewiring layer 300. Preferably, the metallized wiring can use gold wire, aluminum wire or copper wire, etc.

The silicon-based fan out package structure of the present disclosure can realize higher-density electrical I/O packaging, and has a smaller interconnection resistance; it is a common and efficient cooling method for all chips with high power consumption value of thermal design.

Figure 3:
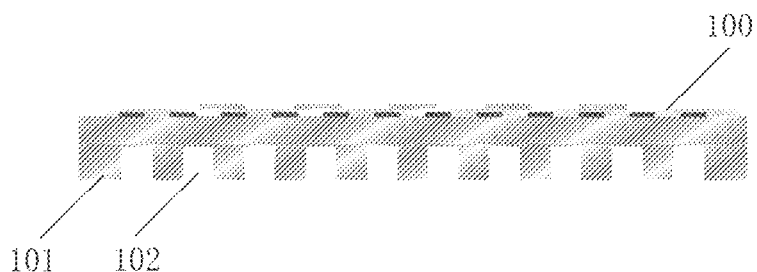
FIG. 3 shows a longitudinal sectional view of a chip with embedded microchannels.

FIG. 3 shows a longitudinal sectional view of a chip with embedded microchannels. Specifically, as shown in FIG. 3, a plurality of embedded microchannels 102 are arranged on the back of the substrate 101 of the chip 100, and these embedded microchannels are arranged in parallel with each other and are not communicated with each other. When choosing parameters such as the length, width, height and spacing of the embedded microchannels, factors that should be considered include that the length being too long will increase the fluid resistance, and the width being too narrow will seriously increase the fluid resistance; when the height is too small, the heat cannot be fully dissipated through the microchannels; and when the height of the microchannels is too large, the heat exchange efficiency will be affected due to the reduction in fin efficiency, neither of which is advantageous for heat dissipation. In order to achieve the optimal heat dissipation performance, each parameter can be simulated and optimized so that appropriate parameters can be selected. Generally, the embedded microchannels are about 0.5-5 mm long and 50-200 μm wide, with the depth/width ratio being about 6:1 to 1:1. The substrate 101 may be a conventional substrate in the art, including but not limited to silicon substrate, silicon carbide substrate, silicon-germanium substrate, gallium arsenide substrate, etc. The chip of the present disclosure has generality. Whether the chip is a RF power chip or a logic digital chip, it can be fitted with the specific manifold channel as long as the embedded microchannels are etched on the back side of the chip.

Figure 4:
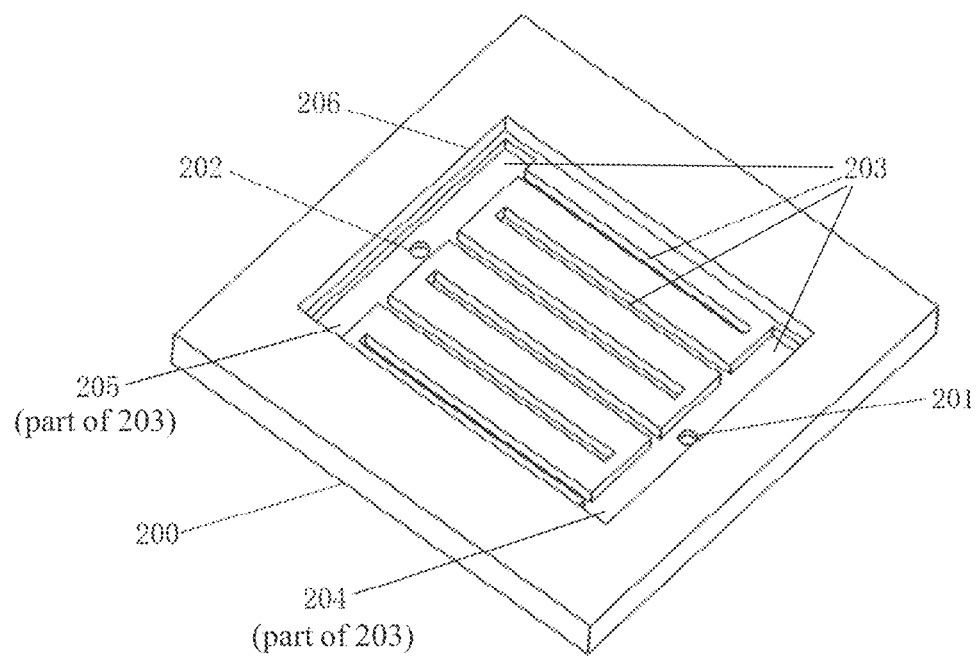
FIG. 4 shows a top sectional view of a silicon-based adapter plate with a manifold channel.

FIG. 4 shows a top sectional view of the silicon-based adapter plate with the manifold channel. Specifically, as shown in FIG. 4, the silicon-based adapter plate 200 includes the groove 206 for burying the chip, the manifold channel 203 located below the groove and communicated with the groove, the liquid inlet 201 and the liquid outlet 202. The manifold channel 203 includes an inflow channel 204 and an outflow channel 205. The inflow channel 204 includes a main inflow channel and a plurality of sub-inflow channels, and the main inflow channel is communicated with the liquid inlet 201. The outflow channel 205 includes a main outflow channel and a plurality of sub-outflow channels, and the main outflow channel is communicated with the liquid outlet 202. The inflow channel 204 and the outflow channel 205 are both of comb type. One end of each sub-inflow channel is communicated with the main inflow channel, and the other end is closed; one end of each sub-outflow channel is communicated with the main outflow channel, and the other end is closed. The inflow channel 204 and the outflow channel 205 are arranged in an interdigital manner and are not communicated with each other. As shown in FIG. 4, each sub-inflow channel and each sub-outflow channel are arranged in parallel. The fluid flow direction in each sub-inflow channel or each sub-outflow channel is perpendicular or nearly perpendicular to the fluid flow direction in the embedded microchannels 102.

Figure 5:
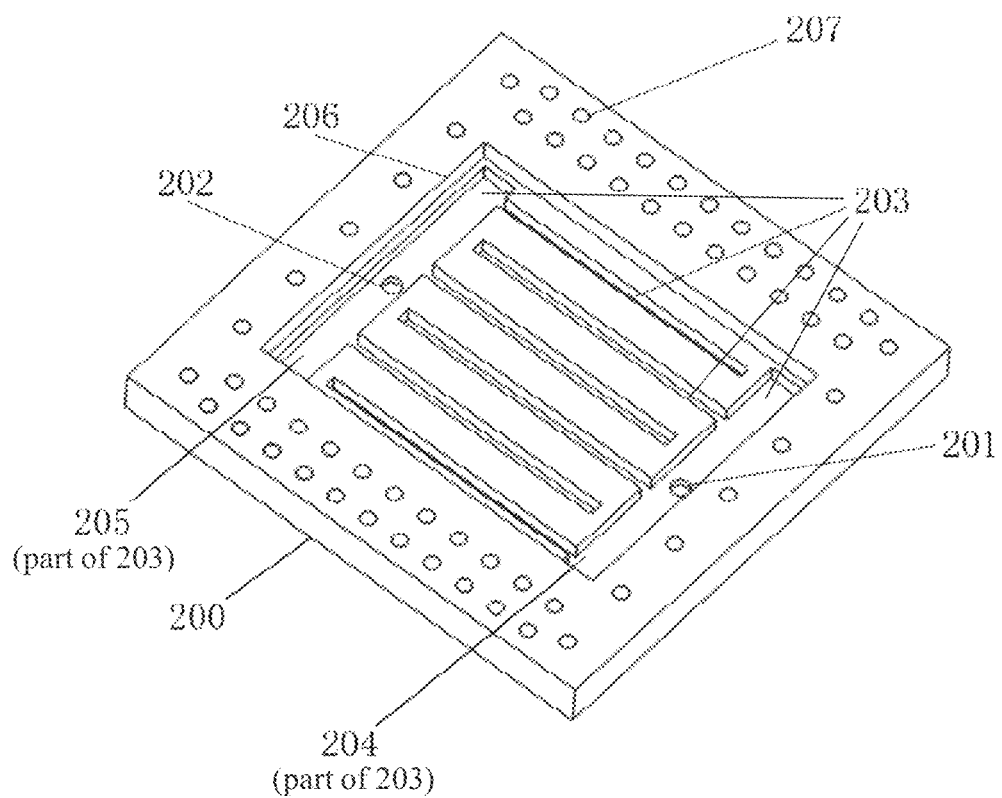
FIG. 5 shows a top sectional view of a silicon-based adapter plate with a manifold channel and having a TSV structure.

FIG. 5 shows a top sectional view of the silicon-based adapter plate with the manifold channel and having a TSV structure. Specifically, as shown in FIG. 5, the silicon-based adapter plate 200 has a TSV structure 207.

Figure 6:
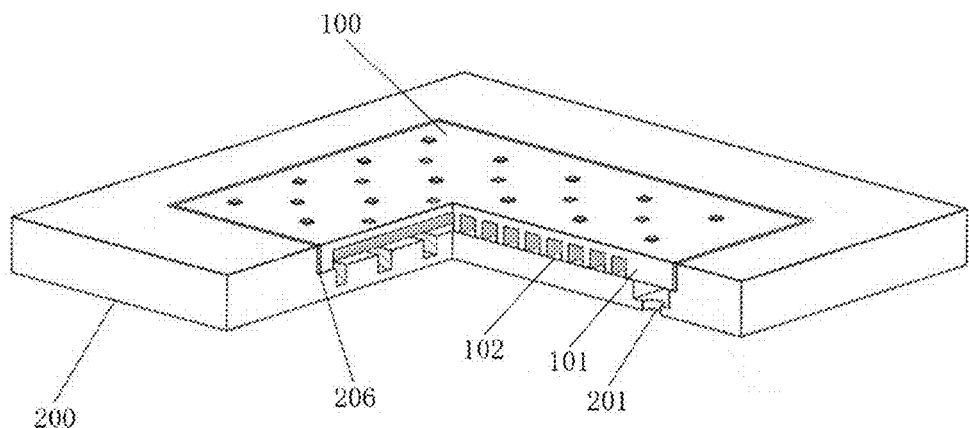
FIG. 6 shows a schematic structural view of a chip with embedded microchannels and the silicon-based adapter plate with a manifold channel after bonding.
Figure 7:
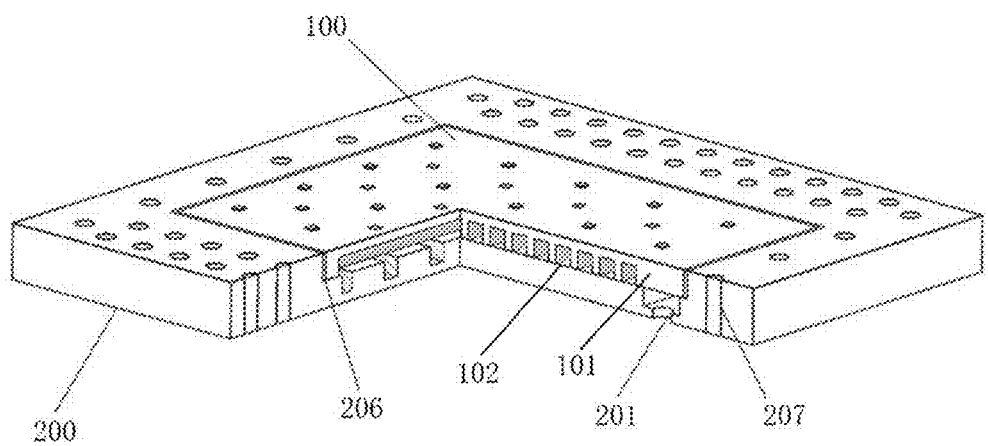
FIG. 7 shows a schematic structural view of a chip with embedded microchannels and the silicon-based adapter plate with a manifold channel and having a TSV structure after bonding.

FIG. 6 shows a schematic structural view of the chip with embedded microchannels and the silicon-based adapter plate with the manifold channel after bonding. FIG. 7 shows a schematic structural view of the chip with embedded microchannels and the silicon-based adapter plate with the manifold channel and having the TSV structure after bonding. There is a low temperature sealing layer between the chip 100 and the silicon-based adapter plate 200. The low temperature sealing layer is used to seal the embedded microchannels 102 and the manifold channel 203 to realize communication among the embedded microchannels 102 and the manifold channel 203, hence forming an embedded manifold type microchannel structure. The low temperature sealing layer can be an adhesive layer or a metal layer. In some embodiments, the adhesive layer may include a thermosetting material or a thermoplastic material. The thermosetting material can be epoxy resin or polyurethane. The thermoplastic material can be polyvinyl acetate or polyvinyl acetal. The metal layer can be obtained by combining the physical vapor deposition (PVD) process, the chemical vapor deposition (CVD) process or the electroplating process and the like with the low temperature eutectic bonding process, and can include one or more metal materials selected from Cu, Sn, Pb, In, Au, Ag and Sb, etc. In the case of small channel size or batch production, the metal layer obtained by combining the physical vapor deposition (PVD) process, the chemical vapor deposition (CVD) process or the electroplating process and the like with the low temperature eutectic bonding process is more appropriate than the adhesive layer. In the present disclosure, low temperature refers to a temperature below 300° C.

The cooling fluid used in combination with the above embedded manifold type microchannel structure can be deionized water, or a special coolant with a low boiling point (e.g., 40° C.-80° C.), so that the cooling process is phase change cooling, thus improving heat dissipation capacity and temperature uniformity.

As compared with other non-embedded heat dissipation means, the embedded manifold type microchannel structure of the present disclosure avoids the conductive thermal resistance of internal materials of the package and the interface thermal resistance between different materials, which obtains higher heat dissipation efficiency, greatly reduces the temperature rise of high-power chips, ensures the stable operation of the chip in a high-performance mode, and prolongs a service life of the chip.

Figure 8:
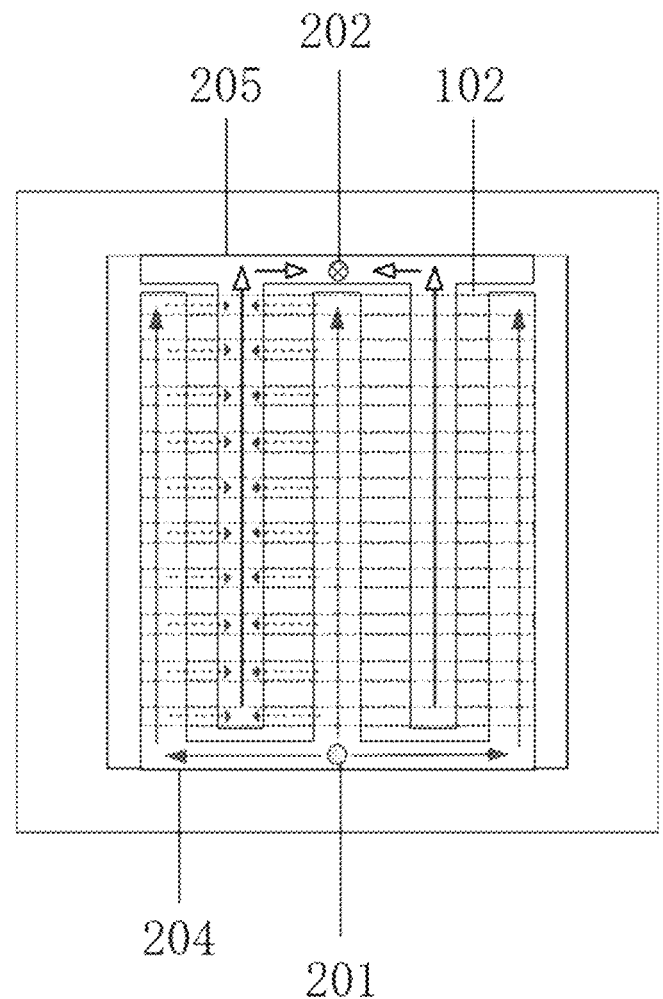
FIG. 8 is a schematic view of a cooling fluid path of the present disclosure.

FIG. 8 shows the flow of cooling fluid in the embedded microchannels 102, the inflow channel 204 and the outflow channel 205. The cooling fluid flows in from the liquid inlet

201 and flows in the inflow channel 204 as shown by solid-line arrows. Since the inflow channel 204 is closed at the end away from the liquid inlet 201, the cooling fluid then flows into the embedded microchannels 102 of the chip as shown by dotted-line arrows to exchange heat with the heat source chip, and then flows along the outflow channel 205 as shown by hollow arrows. Since the outflow channel 205 is closed at the end away from the liquid outlet 202, the cooling fluid finally flows out of the liquid outlet 202 to complete the whole fluid cooling process. This design enables the cooling fluid flowing through the entire surfaces of the embedded microchannels 102 to take away the heat generated by the chip 100, so as to achieve the purpose of efficient heat dissipation.

In a specific embodiment, the present disclosure provides a preparation method for a lead wire bonding structure including embedded manifold type microchannels, which includes the following steps.

A chip is provided, and embedded microchannels are fabricated on a back of a substrate of the chip.

When the chip 100 is in a wafer state, a wafer thickness of the chip 100 is first thinned before fabricating the embedded microchannels 102; for example, the wafer is thinned to a thickness of 300-500 μm, preferably 350-450 μm. This thickness requires that even after the embedded microchannels for heat dissipation are etched on a back cavity, the silicon chip can still maintain strength reliability. Then, the embedded microchannels 102 are fabricated on the back of the substrate 101 of the chip 100 by combining the wafer photolithography process with the wafer etching process. The etching process includes conventional wet etching and dry etching, and the dry etching can include ion milling etching, plasma etching and deep reaction ion etching. In a specific embodiment of the present disclosure, the embedded microchannels 102 are fabricated on the substrate 101 of the chip 100 by combining the wafer photolithography process with the wafer deep reaction ion etching process; after that, the chip obtained is diced, and the wafer test is conducted to select the known good dies (KGD). The present disclosure does not impose special limitation on the geometric sizes of the embedded microchannels 102. The geometric sizes of the embedded microchannels 102 can be designed in combination with flow resistance and thermal resistance.

When the chip 100 is in a die state, the embedded microchannels 102 can be fabricated by combining a hard mask with the etching process or by combining the photolithography process with the etching process. Here, the etching process includes conventional wet etching and dry etching, and the dry etching can include ion milling etching, plasma etching and deep reaction ion etching.

A silicon-based adapter plate 200 is prepared, which includes a groove for burying the chip, a manifold channel located below the groove and communicated with the groove, a liquid inlet and a liquid outlet. The silicon-based adapter plate of the present disclosure can be prepared based on a silicon wafer. The present disclosure does not impose special limitation on the method for forming the groove, and the groove can be formed by photolithography process, etching process or a combination thereof, etc. The etching process includes conventional wet etching and dry etching, and the dry etching can include ion milling etching, plasma etching and deep reaction ion etching. The methods for fabricating the manifold channel 203, the liquid inlet 201 and the liquid outlet 202 in the present disclosure can be conventional processing methods in the art, such as photolithography process, etching process, or a combination thereof, etc. For a specific structure of the obtained manifold channel 203, the manifold channel 203 includes an inflow channel 204 and an outflow channel 205. The inflow channel 204 includes a main inflow channel and a plurality of sub-inflow channels, and the main inflow channel is communicated with the liquid inlet 201. The outflow channel 205 includes a main outflow channel and a plurality of sub-outflow channels, and the main outflow channel is communicated with the liquid outlet 202. The inflow channel 204 and the outflow channel 205 are both of comb type. One end of each sub-inflow channel is communicated with the main inflow channel, and the other end is closed; one end of each sub-outflow channel is communicated with the main outflow channel, and the other end is closed. The inflow channel 204 and the outflow channel 205 are arranged in an interdigital manner and are not communicated with each other. As shown in FIG. 4, each sub-inflow channel and each sub-outflow channel are arranged in parallel. The fluid flow direction in each sub-inflow channel or each sub-outflow channel is perpendicular or nearly perpendicular to the fluid flow direction in the embedded microchannels 102.

In addition, the step of preparing the silicon-based adapter plate 200 may also include preparing a TSV structure on the silicon-based adapter plate. The present disclosure does not impose special limitation on the preparation method for the TSV structure. A through silicon via (TSV) may be formed on the silicon-based adapter plate by using, for example, the photolithography process, the etching process, or a combination thereof, etc. The etching process includes conventional wet etching and dry etching, and the dry etching can include ion milling etching, plasma etching and deep reaction ion etching. Then, the TSV can be filled with conductive materials by electroplating or CVD or the like to form the TSV structure. Conventional filler materials can include metal Cu, W or polysilicon, etc.

After fabricating the chip 100 with the embedded microchannels 102 and the silicon-based adapter plate 200 with the manifold channel 203, the embedded microchannels 102 of the chip 100 are aligned with the manifold channel 203 of the adapter plate 200, so that the fluid flow direction in each sub-inflow channel or each sub-outflow channel is perpendicular or nearly perpendicular to the fluid flow direction in the embedded microchannels 102.

Then, a low temperature sealing layer is formed between the chip 100 and the silicon-based adapter plate 200 to seal the embedded microchannels 102 and the manifold channel 203, so that the embedded microchannels 102 can communicate with the inflow channel 204 and the outflow channel 205.

The methods for forming the low temperature sealing layer include curing an adhesive. The low temperature sealing layer can be an adhesive layer formed by using a thermosetting material or a thermoplastic material. The thermosetting material can be epoxy resin or polyurethane, and the thermoplastic material can be polyvinyl acetate or polyvinyl acetal.

The methods for forming the low temperature sealing layer also include forming the low temperature sealing layer using a metal material by combining any one of the physical vapor deposition process, the chemical vapor deposition process and the electroplating process with the low temperature eutectic bonding process. The metal material can be selected from one or more of Cu, Sn, Pb, In, Au, Ag and Sb. Here, low temperature refers to a temperature below 300° C.

The thickness of the adhesive layer and the surface-mounting pressure can be designed in combination with the size of the embedded microchannels of the chip. If the size of the embedded microchannels is small, the thickness of the adhesive layer and the surface-mounting pressure should not be too large, which would otherwise cause serious glue overflow and block the channels. In addition, the curing temperature determines the curing strength. Therefore, if a strong bonding strength is required, the curing temperature can be appropriately increased to extend the curing time.

In the case of small embedded microchannel size or batch production, low temperature eutectic bonding is more suitable than low temperature curing adhesive gluing. Preferably, low temperature eutectic bonding can include Cu/Sn eutectic bonding, Pb/Sn eutectic bonding and Pb/In eutectic bonding. The bonding temperature of low temperature eutectic bonding process is below 300° C., and the bonding pressure depends on the area of bonding interface. Before the low temperature eutectic bonding step, it is necessary to prepare eutectic solder on two bonding surfaces respectively. The solder on the back side of the chip with embedded microchannels can be directly prepared by physical vapor deposition (PVD) or chemical vapor deposition (CVD), or an adhesion layer and a seed layer can be first prepared on the back side of the chip before the embedded microchannels are fabricated, and then the solder is prepared on the seed layer by electroplating after the embedded microchannels are fabricated. The solder on the side of the silicon-based adapter plate with the groove, the manifold channel, the liquid inlet and the liquid outlet can be directly prepared by physical vapor deposition (PVD) or chemical vapor deposition (CVD), or an adhesion layer and a seed layer can be first prepared on a front side of the silicon-based adapter plate before the groove, the manifold channel, the liquid inlet and the liquid outlet are fabricated, and then the solder is prepared on the seed layer by electroplating after the groove, the manifold channel, the liquid inlet and the liquid outlet are fabricated. The adhesion layer and the seed layer can be prepared by the physical vapor deposition (PVD) process.

Finally, a rewiring layer is prepared at a top of the chip to realize fan out of I/O of the chip, lead out pads in the chip area and arrange them in the entire adapter plate area, and enlarge pad pitch. The present disclosure does not impose special limitation on the preparation method for the rewiring layer. Polymer thin film materials (such as benzocyclobutylene (BCB) or polyimide (PI)) and metallized wiring can be used to form the rewiring layer. The present disclosure does not impose special limitation on the material of metallized wiring in the rewiring layer 300. Preferably, the metallized wiring can use gold wire, aluminum wire or copper wire, etc.

It can be seen from the above that the preparation process of the present disclosure is simple; it is only required to etch the heat dissipation microchannels on the target chip so that the chip can be glued with the manifold channel adapter plate; it is also possible to prepare metal thin films on both bonding surfaces respectively, and IC compatible low temperature eutectic bonding is used to achieve channel sealing. No bulky metal heat dissipation fins, heat dissipation fans or heat dissipation cold plates are required to be integrated in the present disclosure, which can greatly reduce the volume of the heat dissipation system and improve the integration level of the package structure.

The present disclosure is compatible with the silicon-based fan out packaging process. Since the embedded microchannels and the manifold channel of the present disclosure are both designed based on the silicon-based fan out package structure, the flow path structure does not affect the electrical structure, so the flow channel design can be added in the existing silicon-based fan out solution without changing the electrical design, thus achieving the embedded microchannels cooling solution in the silicon-based fan out package.

The present disclosure is compatible with 2.5D and 3D integration modes. Since TSV is pre-buried in the adapter plate, electrical signals can be led out from upper and lower sides of the adapter plate respectively. If the heat dissipation target is a high-power chip such as a processor, low-power-consumption chips such as a memory can be stacked on the top, which are then connected to a substrate or PCB through TSV and bump structure to complete packaging; it is an efficient cooling method suitable for all bottom chips of 2.5D and 3D integration modes.

The present disclosure will be further described below in combination with specific embodiments, but the present disclosure is not limited to these embodiments.

First Embodiment

First, a chip 100 in a wafer state with a device layer and electrical I/O pads is prepared. Then, according to the conventional wafer photolithography process and wafer etching process, embedded microchannels 102 are etched in a back cavity of the substrate of the chip. After dicing, the wafer test is conducted to select the KGD, obtaining the chip structure as shown in FIG. 3.

A groove 206 for burying the chip 100 is etched on the silicon wafer; then, an inflow channel 204, an outflow channel 205, a liquid inlet 201 and a liquid outlet 202 for fluid distribution are etched at the bottom of the groove 206 to obtain the silicon-based adapter plate 200 as shown in FIG. 4. In order to enable the chip 100 to be buried in the groove 206, the size of the groove 206 is slightly larger than the size of the chip 100.

A low temperature curing epoxy resin adhesive of an appropriate thickness is applied or dipped onto the back side of the chip structure as shown in FIG. 3, which is then aligned with the manifold channel in the silicon-based adapter plate 200 as shown in FIG. 4 (so that the fluid flow direction in each sub-inflow channel or each sub-outflow channel is perpendicular or nearly perpendicular to the fluid flow direction in the embedded microchannels 102) before surface-mounting to its surface, realizing sealed gluing of the channels after curing and obtaining the structure as shown in FIG. 6.

The gap between the chip 100 and the silicon-based adapter plate 200 is filled. Then, a compatible surface planarization material is spin-coated onto the surface of the chip 100, forming a planarization layer after curing, or the chemical vapor deposition (CVD) process is used to deposit polymers such as parylene onto the surface after surface mounting, and then the planarization layer is etched above the electrical I/O pads of the chip 100 to form a window structure, exposing the electrical I/O pads.

Then, a rewiring layer 300 is prepared to realize fan out of I/O of the chip, lead out the electrical I/O pads in the chip area and arrange them in the entire adapter plate area, and enlarge pad pitch. Bumps are made on the rewiring layer 300 through the electroplating process to meet the requirements of large size and large pitch for interconnection with the substrate or PCB. The obtained structure is shown in FIG. 1, in which the bumps are connected with the electrical I/O pads in the chip 100 through the rewiring layer 300, and electrical I/O signals are led out through the bumps. Finally, fluid I/O ports are surface-mounted at the liquid inlet 8 and the liquid outlet 9 of the silicon-based manifold channel adapter plate to realize the silicon-based fan out embedded microchannel cooling technology with integrated electrical I/O and fluid I/O.

The flow of cooling fluid is shown in FIG. 8. The fluid flows in from the liquid inlet 201 and flows in the inflow channel 204 as shown by solid-line arrows; then the fluid flows into the embedded microchannels 102 of the chip 100 as shown by dotted-line arrows to exchange heat with the heat source chip, and then flows along the outflow channel 205 as shown by hollow arrows; finally, the fluid flows out of the liquid outlet 202 to complete the whole fluid cooling process.

Second Embodiment

This embodiment is implemented according to the method described in the first embodiment, except that: 1) while etching the groove 206, the inflow channel 204, the outflow channel 205, the liquid inlet 201 and the liquid outlet 202 on the silicon-based adapter plate, a TSV is etched and filled with a conductive material (polysilicon) through the electroplating process to form the TSV structure 207; the obtained silicon-based adapter plate structure is shown in FIG. 5; 2) the structure as shown in FIG. 7 is obtained after sealing the channels; and 3) in addition to fabricating bumps (for stacking other low-power-consumption chips) on the rewiring layer 300 through the electroplating process, bumps (for FC packaging) are also fabricated on a lower surface of the silicon-based adapter plate 200 through the electroplating process to meet the requirements of large size and large pitch for interconnection with the substrate or PCB; the obtained structure is shown in FIG. 2.

Third Embodiment

This embodiment is implemented according to the method described in the second embodiment, except that the chip 100 in a wafer state with a device layer and electrical I/O pads is first provided; then, Ti/Cu 100/300 nm is prepared on the back side of the chip 100 by the physical vapor deposition (PVD) process as an adhesion layer and a seed layer respectively; after that, according to the conventional wafer photolithography process and wafer etching process, the embedded microchannels 102 are etched in the back cavity of the chip, and Cu/Sn 6/2 μm is plated on the seed layer after the photoresist is removed, obtaining the chip structure with solder and embedded microchannels 102. After dicing, the wafer test is conducted to select the KGD. The process sequence of PVD+etching+electroplating can ensure that there is no metal in the microchannels, thus reducing the impact on the flow. Then, at the bonding interface of the silicon-based adapter plate structure as shown in FIG. 5, a Cu layer with a thickness of about 6 μm is directly prepared by the physical vapor deposition (PVD) process to obtain a silicon-based adapter plate structure with solder. Finally, after the embedded microchannels of the chip structure with solder are aligned with the manifold channel of the silicon-based adapter plate structure with solder (so that the fluid flow direction in each sub-inflow channel or each sub-outflow channel is perpendicular or nearly perpendicular to the fluid flow direction in the embedded microchannels 102), eutectic bonding is performed at a certain bonding pressure and a bonding temperature of about 240° C., thus realizing the sealed gluing of the channels.

Described above are only preferred specific embodiments of the present disclosure, but the scope of protection of the present disclosure is not limited to this. Any change or replacement that can be easily conceived by those skilled in the art within the technical scope disclosed by the present disclosure should be covered within the scope of protection of the present disclosure. Therefore, the scope of protection of the present disclosure shall be accorded with the scope of protection of the claims.

The invention claimed is:

1. A silicon-based fan out package structure comprising embedded manifold type microchannels, comprising:
    a chip comprising a substrate and embedded microchannels located on a back of the substrate;
    a silicon-based adapter plate comprising a groove for burying the chip, a manifold channel located within the groove, a liquid inlet and a liquid outlet, wherein the embedded microchannels are sealed to the manifold channel via sealing materials located between the chip and the silicon-based adapter plate; and
    a rewiring layer at a top of the chip.

2. The silicon-based fan out package structure according to claim 1, wherein the silicon-based adapter plate further comprises a TSV structure.

3. The silicon-based fan out package structure according to claim 1, wherein the manifold channel comprises an inflow channel and an outflow channel.

4. The silicon-based fan out package structure according to claim 3, wherein the inflow channel and the outflow channel are both of comb type.

5. The silicon-based fan out package structure according to claim 1, wherein the sealing materials are an adhesive layer or a metal layer.

6. The silicon-based fan out package structure according to claim 5, wherein the metal layer comprises one or more metal materials selected from Cu, Sn, Pb, In, Au, Ag and Sb, and the metal layer is obtained by combining any one of a physical vapor deposition process, a chemical vapor deposition process and a electroplating process with a low temperature eutectic bonding process.

7. A preparation method for a silicon-based fan out package structure comprising embedded manifold type microchannels, the preparation method comprising:
    providing a chip comprising a substrate;
    fabricating embedded microchannels on a back of the substrate of the chip;
    preparing a silicon-based adapter plate comprising a groove for burying the chip, a manifold channel located within the groove, a liquid inlet and a liquid outlet;
    sealing the chip and the silicon-based adapter plate to seal the embedded microchannels with the manifold channel; and
    preparing a rewiring layer at a top of the chip.

8. The preparation method according to claim 7, wherein the chip is in a wafer state or die state.

9. The preparation method according to claim 7, wherein the step of preparing the silicon-based adapter plate further comprises preparing a TSV structure on the silicon-based adapter plate.

10. The preparation method according to claim 7, wherein sealing the chip and the silicon-based adapter plate comprises curing an adhesive.

11. The preparation method according to claim 7, wherein sealing the chip and the silicon-based adapter plate comprises using a metal material by combining any one of a physical vapor deposition process, a chemical vapor deposition process and a electroplating process with a low temperature eutectic bonding process.

12. The preparation method according to claim 11, wherein the metal material is selected from one or more of Cu, Sn, Pb, In, Au, Ag and Sb.

\* \* \* \* \*